(12) United States Patent
Anderson et al.

(10) Patent No.: US 11,158,537 B2
(45) Date of Patent: Oct. 26, 2021

(54) TOP VIAS WITH SUBTRACTIVE LINE FORMATION

(71) Applicant: INTERNATIONAL BUSINESS MACHINES CORPORATION, Armonk, NY (US)

(72) Inventors: Brent Anderson, Jericho, VT (US); Lawrence A. Clevenger, Saratoga Springs, NY (US); Nicholas Anthony Lanzillo, Wynantskill, NY (US); Christopher J. Penny, Saratoga Springs, NY (US); Kisik Choi, Watervliet, NY (US); Robert Robison, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 3 days.

(21) Appl. No.: 16/750,062

(22) Filed: Jan. 23, 2020

(65) Prior Publication Data

US 2021/0233808 A1    Jul. 29, 2021

(51) Int. Cl.
*H01L 21/768* (2006.01)
*H01L 21/311* (2006.01)
*H01L 21/02* (2006.01)

(52) U.S. Cl.
CPC .. *H01L 21/76832* (2013.01); *H01L 21/02126* (2013.01); *H01L 21/31144* (2013.01); *H01L 21/76816* (2013.01); *H01L 21/76877* (2013.01); *H01L 21/76885* (2013.01); *H01L 21/76897* (2013.01)

(58) Field of Classification Search
CPC ......... H01L 21/76832; H01L 21/76816; H01L 21/02126; H01L 21/76897; H01L 21/31144; H01L 21/76885; H01L 21/76877
See application file for complete search history.

(56) References Cited

U.S. PATENT DOCUMENTS

| | | |
|---|---|---|
| 5,512,514 A | 4/1996 | Lee |
| 5,693,568 A | 12/1997 | Liu et al. |
| 7,049,702 B2 | 5/2006 | Tseng |
| 9,613,861 B2* | 4/2017 | Anderson ........... H01L 23/5226 |
| 9,716,038 B2 | 7/2017 | Chen et al. |
| 10,020,223 B1 | 7/2018 | Anderson et al. |
| 2015/0056800 A1 | 2/2015 | Mebarki et al. |
| 2018/0226289 A1 | 8/2018 | Bielefeld et al. |
| 2019/0019748 A1 | 1/2019 | Wallace et al. |
| 2021/0057333 A1* | 2/2021 | Tsai ..................... H01L 23/5283 |

FOREIGN PATENT DOCUMENTS

WO    2017052559 A1    3/2017

* cited by examiner

*Primary Examiner* — Karen Kusumakar
(74) *Attorney, Agent, or Firm* — Tutunjian & Bitetto, P.C.; Randall Bluestone (57) ABSTRACT

Integrated chips and methods of forming the same include forming a conductive layer to a line height. A dielectric layer is formed over the conductive layer to a via height, with at least one opening that exposes a via region of the conductive layer. A conductive via is formed in the opening having the via height. The conductive layer is patterned to form a conductive line having the line height.

18 Claims, 7 Drawing Sheets

TOP VIAS WITH SUBTRACTIVE LINE FORMATION

BACKGROUND

The present invention generally relates to integrated chip fabrication and, more particularly, to the fabrication of conductive lines and vias in multi-layer integrated chips.

When fabricating conductive lines in a dielectric layer, variability in a trench etch causes variability in the conductive lines that are formed in the trench. An over-etch results in conductive lines that are taller than anticipated, while an under-etch results in conductive lines that are shorter than anticipated. This variation results in parasitic delay, which degrades chip performance.

SUMMARY

A method of forming an integrated chip includes forming a conductive layer to a line height. A dielectric layer is formed over the conductive layer to a via height, with at least one opening that exposes a via region of the conductive layer. A conductive via is formed in the opening having the via height. The conductive layer is patterned to form a conductive line having the line height.

A method of forming an integrated chip includes depositing a layer of conductive material onto an underlying layer to a line height in a single deposition process. A dielectric layer is formed over the conductive layer to a via height, with at least one opening that exposes a via region of the conductive layer. A conductive via is formed in the opening having the via height. The conductive layer is patterned to form a conductive line having the line height. An interlayer dielectric is formed around the conductive line, after the conductive layer has been patterned, to a height of a top surface of the conductive via, from an ultra-low-k dielectric material.

An integrated chip includes conductive lines, having a line height that varies by less than one nanometer, each conductive line being formed with a profile that is narrower at a top surface of the line than at a bottom surface of the line.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention form conductive lines in integrated chips by forming a conductive layer to a target height first. Because deposition thickness can be controlled with greater precision than an etch depth, the resulting conductive lines can be formed with a high degree of consistency within a given chip, and between chips. A dielectric backfill can also be formed after forming lines and vias, further reducing capacitance and increasing performance.

Figure 1:
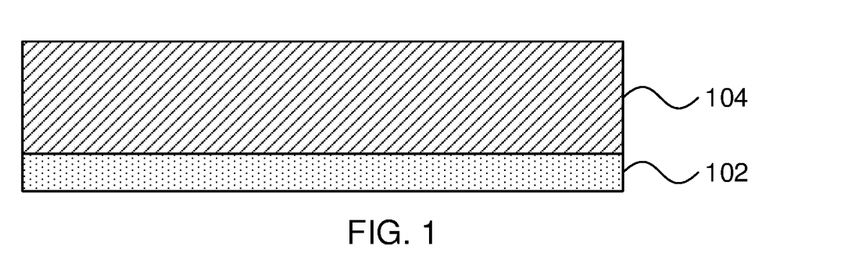
FIG. 1 is a cross-sectional view of a step in the fabrication of conductive lines in an integrated chip, showing the formation of a conductive layer to a line height, in accordance with an embodiment of the present invention.

Referring now to the drawings in which like numerals represent the same or similar elements and initially to FIG. 1, a cross-sectional view of a step in the fabrication of a multi-layer integrated chip is shown. A substrate layer 102 is shown. In some embodiments, the substrate layer 102 can be formed from, e.g., a dielectric material such as silicon dioxide or a glass material. The substrate layer 102 can include active and/or passive electronic components, such as transistors, capacitors, transmission lines, vias, etc. There can additionally be one or more further layers underlying the substrate layer 102, with connectivity between the layers being provided by via structures. In embodiments where the layer shown is the bottommost level of lines, the substrate layer 102 can be an oxide layer with active components and electrical interconnects. If the layer is not the bottommost level, then the substrate layer 102 can include one or more additional layers of conductive lines and vias, embedded in an interlayer dielectric.

A layer of conductive material 104 is formed over the substrate layer 102. The conductive layer 104 can be formed from any appropriate conductive material, for example a metal, such as tungsten, nickel, titanium, molybdenum, tantalum, copper, platinum, silver, gold, ruthenium, iridium, rhenium, rhodium, cobalt, and alloys thereof. The conductive layer 104 can alternatively be formed from a doped semiconductor material such as, e.g., doped polysilicon. It is specifically contemplated that the conductive layer 104 can be formed to a target height with high precision.

For example, when using atomic layer deposition (ALD), layers of material are deposited with a thickness of one atom at a time. In such an embodiment, the precision of the layer's thickness can be greater than one nanometer (e.g., about ±0.5 nm). This contrasts to the precision of etched features, which can have precisions between about ±1 nm to about ±10 nm. As such, the present embodiments provide an improved degree of precision in fabricating conductive lines to specified heights, for example with a thickness of the conductive layer 104 being between about 20 nm and about 100 nm, with a precision of about ±0.5 nm.

It should be understood that the conductive layer 104 can be formed using any appropriate deposition process, such as chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
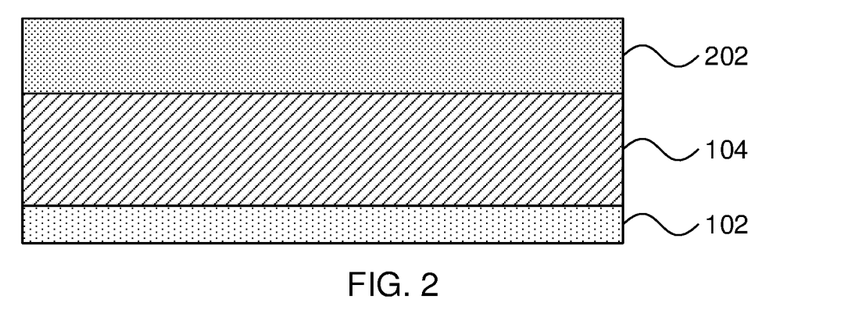
FIG. 2 is a cross-sectional view of a step in the fabrication of conductive lines in an integrated chip, showing the formation of a dielectric layer on the conductive layer to a via height, in accordance with an embodiment of the present invention.

Referring now to FIG. 2, a cross-sectional view of a step in the fabrication of a multi-layer integrated chip is shown. A dielectric layer 202 is deposited over the conductive layer 104 by any appropriate deposition process. The height of the dielectric layer 202 determines a via height, relative to the top surface of the conductive layer 104. It should be understood that the dielectric layer 202 can be formed with any appropriate dielectric material, such as silicon dioxide or silicon nitride.

Figure 3:
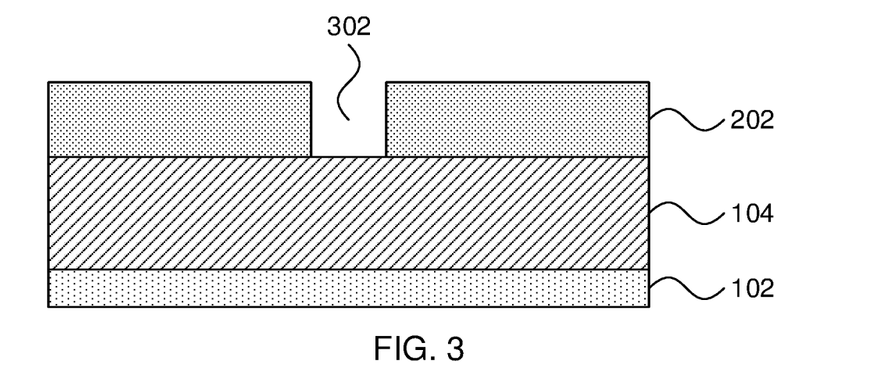
FIG. 3 is a cross-sectional view of a step in the fabrication of conductive lines in an integrated chip, showing the formation of a via opening in the dielectric layer, in accordance with an embodiment of the present invention.

Referring now to FIG. 3, a cross-sectional view of a step in the fabrication of a multi-layer integrated chip is shown. An opening 302 is patterned in the dielectric layer 202. The opening 302 can be formed by any appropriate patterning process, such as by forming a photolithographic mask on the dielectric layer 202 to expose the surface of the dielectric layer 202 where the opening 302 will be formed, followed by an anisotropic etch, such as a selective reactive ion etch (RIE) to form the opening 302. As used herein, the term "selective," in reference to a material removal process, denotes that the rate of material removal for a first material is greater than the rate of removal for at least another material of the structure to which the material removal process is being applied.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 4:
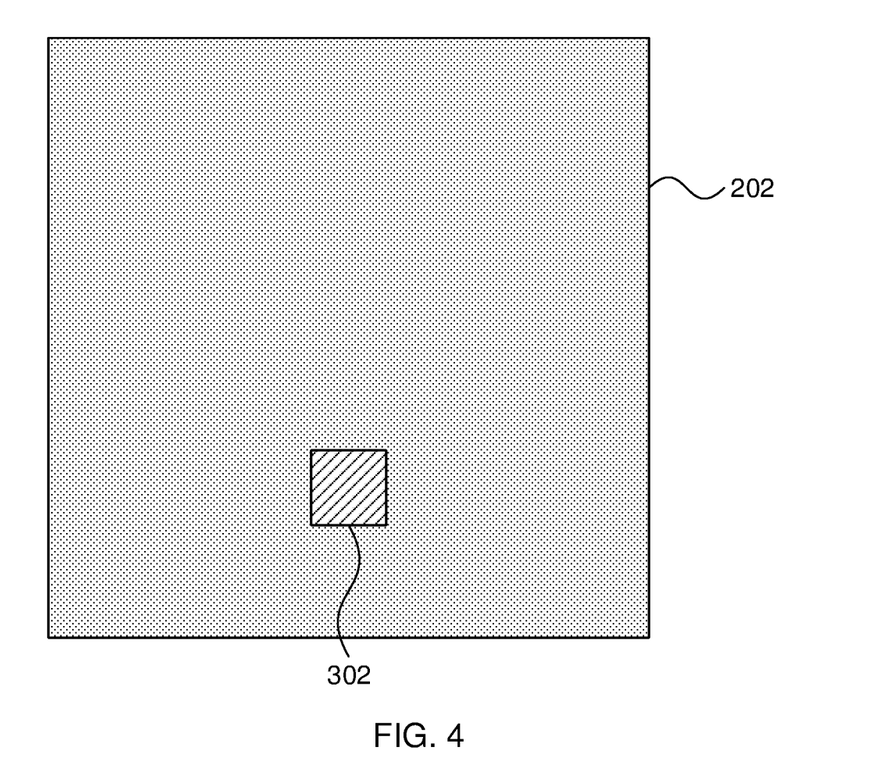
FIG. 4 is a top-down view of a step in the fabrication of conductive lines in an integrated chip, showing the via opening in the dielectric layer, in accordance with an embodiment of the present invention.

Referring now to FIG. 4, a top-down view of a step in the fabrication of a multi-layer integrated chip is shown. The opening 302 in the dielectric layer 202 exposes a portion of the top surface of the underlying conductive layer 104. Any number of such openings 302 can be formed, positioned according to conductive line positioning and via positioning.

Figure 5:
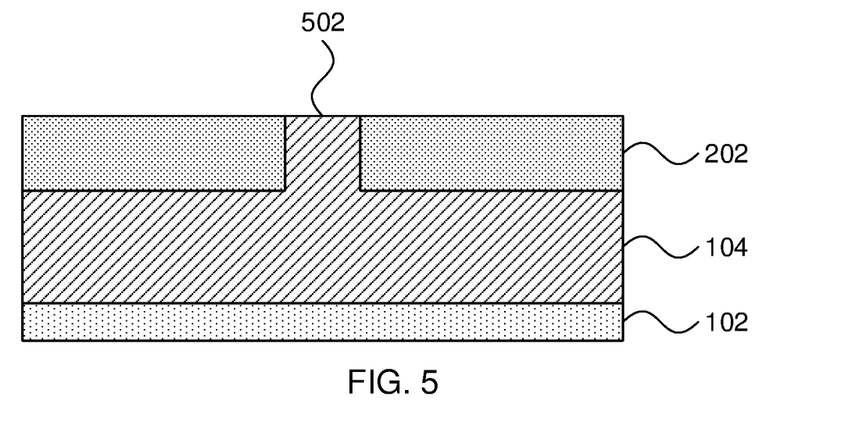
FIG. 5 is a cross-sectional view of a step in the fabrication of conductive lines in an integrated chip, showing the formation of a via in the opening, in accordance with an embodiment of the present invention.

Referring now to FIG. 5, a cross-sectional view of a step in the fabrication of a multi-layer integrated chip is shown. Additional conductive material is deposited, by any appropriate deposition process, to fill the opening 302 and thereby form via 502. The total height of the via 502 is determined by the combined height of the conductive layer 104 and the dielectric layer 202. After deposition of the additional conductive material, the excess conductive material can be polished down to the top surface of the dielectric layer 202, for example using chemical mechanical planarization (CMP).

Figure 6:
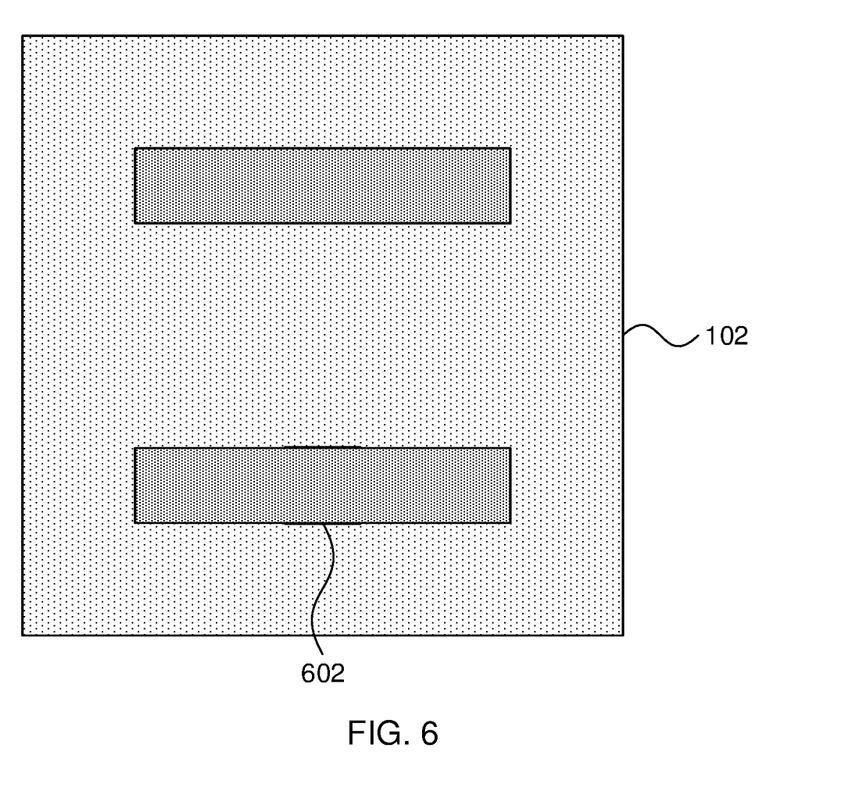
FIG. 6 is a top-down view of a step in the fabrication of conductive lines in an integrated chip, showing the formation of a line pattern mask on the dielectric layer, in accordance with an embodiment of the present invention.

Referring now to FIG. 6, a top-down view of a step in the fabrication of a multi-layer integrated chip is shown. A mask 602 is formed over the dielectric layer 202. One or more selective anisotropic etches can then be used to etch down into the dielectric layer 202 and the conductive layer 104, exposing the underlying substrate layer 102. Although the mask 602 is shown as establishing two-line patterns, it should be understood that any number of such lines can be patterned, in any relative orientation and length. In some embodiments, lines of the mask 602 can be discontinuous, such that cuts will be formed in the resulting lines.

Figure 7:
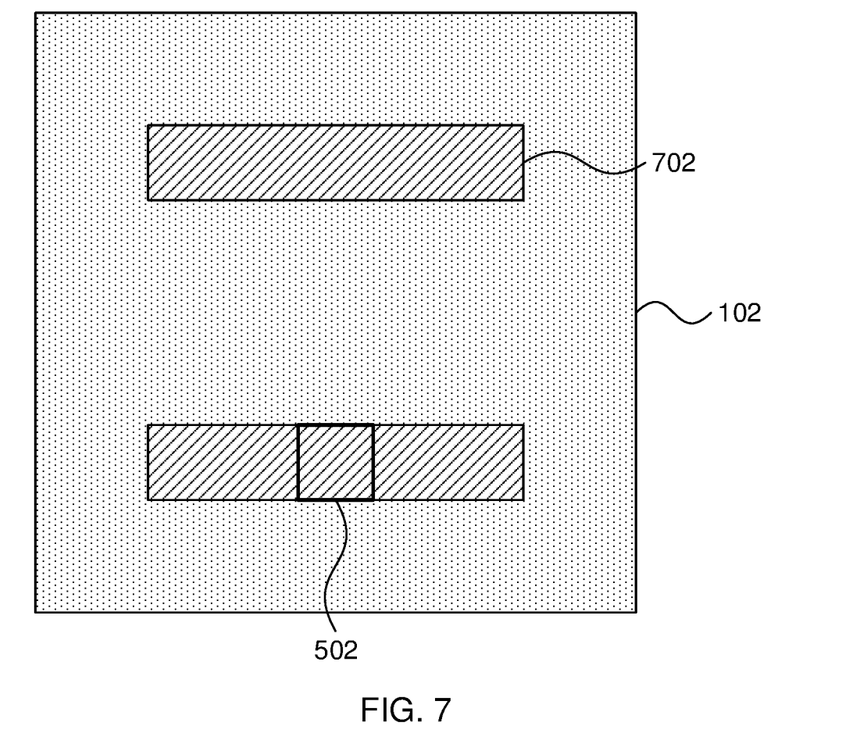
FIG. 7 is a top-down view of a step in the fabrication of conductive lines in an integrated chip, showing patterning of conductive lines using the line pattern mask, and removal of the line pattern mask, in accordance with an embodiment of the present invention.

Referring now to FIG. 7, a top-down view of a step in the fabrication of a multi-layer integrated chip is shown. The mask 602 is etched away using any appropriate isotropic or anisotropic etch, followed by the remaining portions of the dielectric layer 202, exposing the newly etched conductive lines 702 and the via 502.

Figure 8:
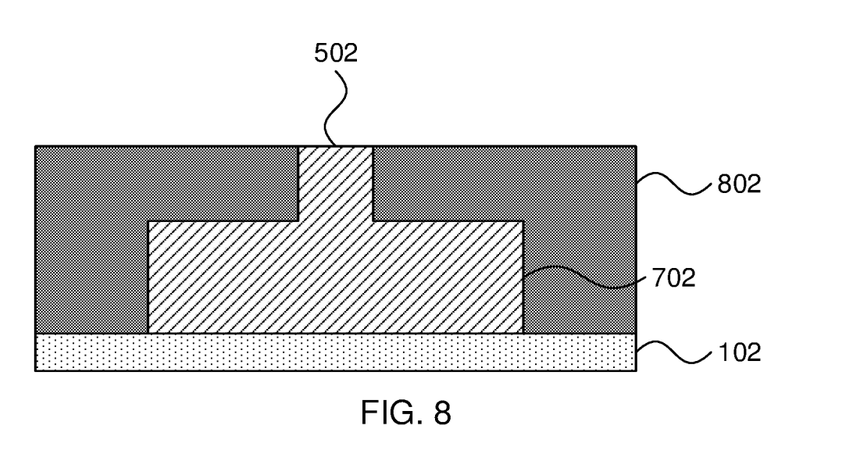
FIG. 8 is a cross-sectional view of a step in the fabrication of conductive lines in an integrated chip, showing the formation of an interlayer dielectric around the conductive lines and via, in accordance with an embodiment of the present invention.

Referring now to FIG. 8, a cross-sectional view of a step in the fabrication of a multi-layer integrated chip is shown. An interlayer dielectric 802 is deposited by any appropriate deposition process, such as CVD, PVD, ALD, GCIB deposition, spin-on deposition, flowable deposition, etc. Any excess material can be removed with a CMP process that stops on the conductive material, thereby exposing the top surface of the via 502. The interlayer dielectric 802 can be formed from any appropriate dielectric material, but an ultra-low-k dielectric material is specifically contemplated to reduce parasitic capacitance.

As used herein, the term "low-k" refers to a material that has a dielectric constant k that is lower than the dielectric constant of silicon dioxide. The term "ultra-low-k" refers to a material that has a dielectric constant substantially lower than that of silicon dioxide. Exemplary low-k dielectric materials include SiCOH, with a dielectric constant between about 2.7 and about 3.0, and exemplary ultra-low-k dielectric materials include octamethylcyclotetrasiloxane, with a dielectric constant of about 2.7.

In alternative embodiments, the formation of the via 502 can be delayed until after the interlayer dielectric 802 is formed. In such an embodiment, the opening 302 would not be formed in the dielectric layer 202, but would be instead formed in the interlayer dielectric 802. The conductive material could then be deposited in the opening to form the final via, with the height of the via being determined by the height of the interlayer dielectric 802, rather than by the height of the earlier dielectric layer 202. In these alternative embodiments, the formation of the first dielectric layer 202 can be omitted entirely.

Figure 11:
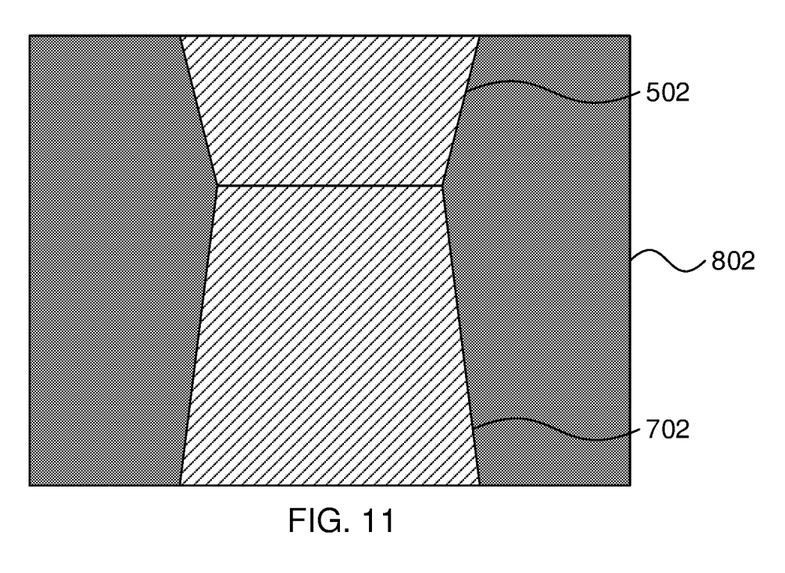
FIG. 11 is an enlarged cross-sectional view of a conductive line and a via that shows the slopes of the sidewalls of these structures.

Referring now to FIG. 11, an enlarged cross-sectional view of a step in the fabrication of a multi-layer integrated chip is shown. This view is shown at a cross-section that is on a plane perpendicular to the cross-section shown in FIG. 8, where the conductive line 702 is cut across its width. In this enlarged view, the slope of the sidewalls of the conductive line 702 is shown, where the width of the line 702 is narrower at the top than at the bottom. This is due to the subtractive fabrication process discussed herein, wherein the line 702 is etched from a larger conductive layer 104, rather than being formed by first forming a trench in a layer of another material and then filling that trench.

Conversely, because the via 502 is formed by etching into a surrounding layer of dielectric material 202 and then filling the opening 302, the via 502 will have an opposite taper, with the top of the via 502 being wider than the bottom of the via 502.

Additionally, because the interlayer dielectric 802 is formed after the line 702 has been patterned, no anisotropic etch is needed to create the shape of the interlayer dielectric 802. Whereas using an anisotropic etch, such as an RIE, would leave a layer of damaged dielectric material at the interface between the dielectric and the line, the present embodiments have no such layer of damaged material.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments d is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS.

is turned over, elements described as "below" or "beneath" other elements or features would then be oriented "above" the other elements car features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or r ore intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 9:
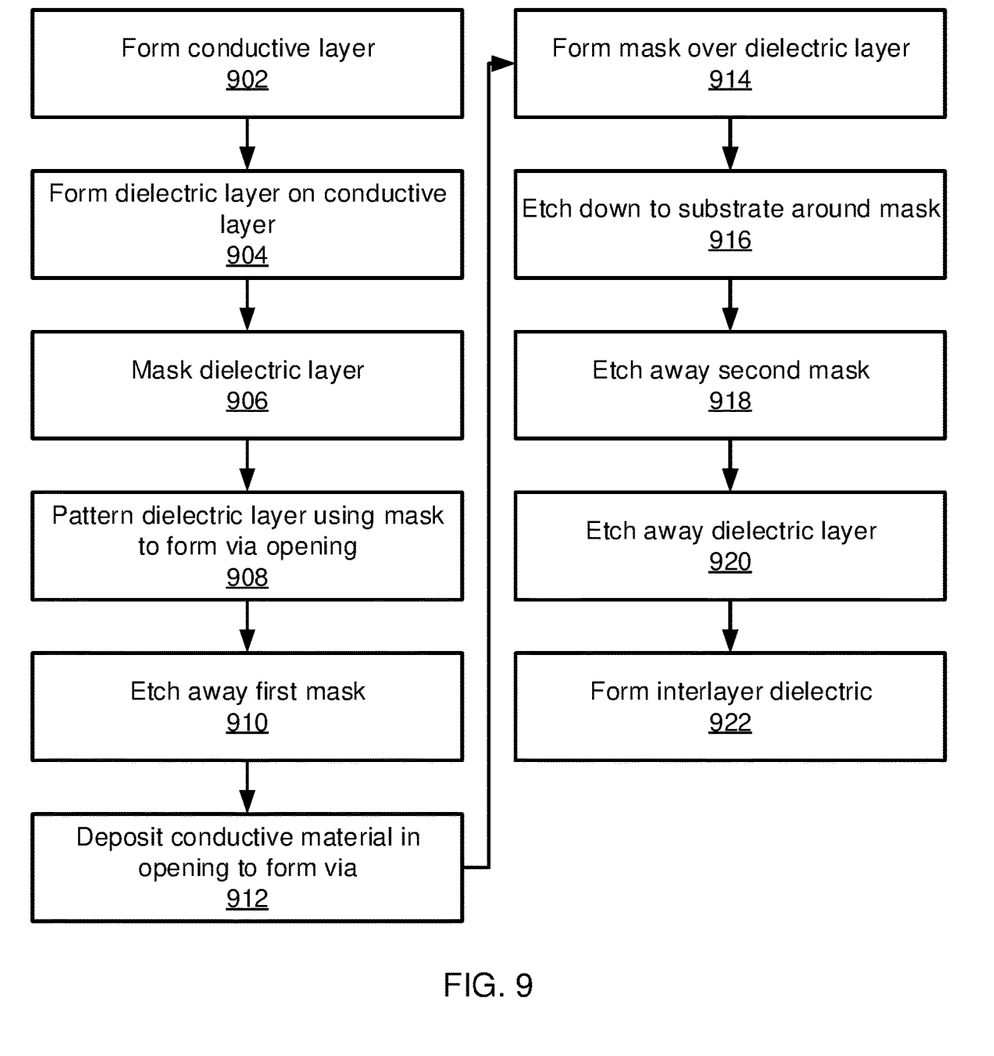
FIG. 9 is a block/flow diagram of a method of fabricating an integrated chip, where vias are formed on the conductive layer before the lines are patterned, in accordance with an embodiment of the present invention.

Referring now to FIG. 9, a method of forming a multi-layer integrated chip is shown. Block 902 forms a conductive layer 104 on a substrate layer 102 from any appropriate conductive material, and by any appropriate deposition process. The height of the conductive layer 104 is selected with high precision to reflect the height of the eventual conductive lines. Block 904 then forms dielectric layer 202 on the conductive layer 104 using any appropriate deposition process. The dielectric layer 202 is formed to a height that reflects the height of the eventual vias above the conductive lines.

Block 906 forms a mask on the dielectric layer 202 using, e.g., any appropriate photolithographic process. The mask includes a pattern with an opening over a portion of the dielectric layer 202, where a via will eventually be formed. Block 908 then uses an anisotropic etch to etch down into the dielectric layer 202, using the mask, to form opening 302 that exposes a portion of the top surface of the conductive layer 104. Block 910 then etches away the mask, exposing the top surface of the dielectric layer 202.

Block 912 deposits conductive material in the opening 302 to form via 502. This step can include, for example, depositing material by any appropriate deposition process and then polishing the material down with a CMP process that stops on the top surface of the dielectric layer 202.

Block 914 forms a second mask over the dielectric layer 202 to define the conductive line regions. Block 916 etches down to the substrate 102 around the second mask using one or more anisotropic etches to remove exposed portions of the dielectric layer 202 and the conductive layer 104. Block 918 etches away the second mask, exposing the top portion of the remaining regions of dielectric layer 202.

Block 920 then etches away the remaining portions of the dielectric layer 202. This exposes the conductive lines 702, with the via 502 extending upward therefrom. An interlayer dielectric 802 is then formed in block 922, over and around the conductive lines 702 and the via 502. The interlayer dielectric material can be deposited by any appropriate process and can then be polished down to the height of the via 502 using a CMP process. In some embodiments, block 920 can be omitted, with portions of the dielectric layer 202 remaining and forming a part of the interlayer dielectric 802 after additional dielectric material is deposited. The dielectric layer 202 and the interlayer dielectric 802 can be formed from the same dielectric material or can, in some embodiments, be formed from different dielectric materials.

Figure 10:
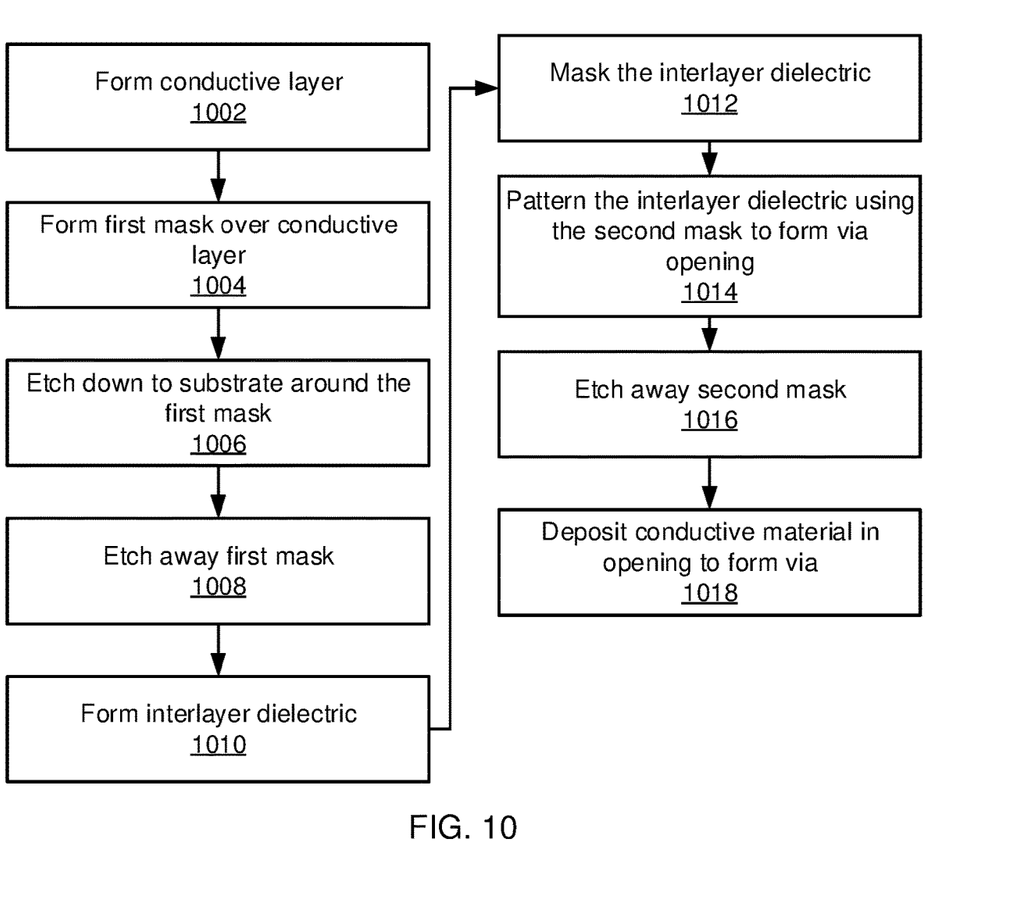
FIG. 10 is a block/flow diagram of a method of fabricating an integrated chip, where vias are formed on the conductive layer after the lines are patterned, in accordance with an embodiment of the present invention.

Referring now to FIG. 10, an alternative embodiment of a method of forming a multi-layer integrated chip is shown. Block 1002 forms a conductive layer 104 on a substrate layer 102 from any appropriate conductive material, and by any appropriate deposition process. The height of the conductive layer 104 is selected with high precision to reflect the height of the eventual conductive lines.

Block 1004 forms a first mask over the conductive layer 104 to define the conductive line regions. Block 1006 etches down to the substrate 102 around the first mask using one or more anisotropic etches to remove exposed portions of the conductive layer 104. Block 1008 etches away the first mask, exposing the top portion of the remaining regions of conductive layer 104.

An interlayer dielectric 802 is then formed in block 1010, over and around the conductive lines. The interlayer dielectric material can be deposited by any appropriate process to a height that represents the combined height of the lines and a via. Block 1012 forms a second mask on the interlayer dielectric 802 using, e.g., any appropriate photolithographic process. The mask second includes a pattern with an opening over a portion of the interlayer dielectric 802. Block 1014 then uses an anisotropic etch to etch down into the interlayer dielectric 802, using the second mask, to form an opening that exposes a portion of the top surface of the conductive lines. Block 1016 then etches away the mask, exposing the top surface of the interlayer dielectric 802. Block 1018 deposits conductive material in the opening to form a conductive via on the conductive lines. This step can include, for example, depositing material by any appropriate deposition process and then polishing the material down with a CMP process that stops on the top surface of the interlayer dielectric 802.

Having described preferred embodiments of top vias with subtractive line formation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an integrated chip, comprising:
   forming a conductive layer to a line height;
   forming a dielectric layer over the conductive layer to a via height, with at least one opening that exposes a via region of the conductive layer;
   forming a conductive via in the opening having the via height;
   patterning the conductive layer to form a conductive line having the line height; and
   forming an interlayer dielectric around the conductive line, to a height of a top surface of the conductive via.

2. The method of claim 1, wherein forming the conductive layer comprises depositing conductive material onto an underlying layer to the line height in a single deposition process.

3. The method of claim 1, wherein forming the dielectric layer comprises depositing dielectric material onto the conductive layer to the via height in a single deposition process.

4. The method of claim 3, wherein forming the dielectric layer further comprises masking the dielectric layer with a mask that exposes a top surface of the dielectric material above the via region of the conductive layer and anisotropically etching the exposed portion of the dielectric material to form the at least one opening.

5. The method of claim 1, wherein patterning the conductive layer comprises masking the dielectric layer with a mask that covers a line region of the conductive layer and anisotropically etching exposed portions of the dielectric layer and the conductive layer to form the conductive line.

6. The method of claim 1, wherein portions of the dielectric layer remain on the conductive line and wherein the interlayer dielectric is not formed over the conductive line.

7. The method of claim 1, further comprising etching away remaining portions of the dielectric layer before forming the interlayer dielectric.

8. The method of claim 1, wherein the interlayer dielectric is formed from an ultra-low-k dielectric material.

9. The method of claim 1, wherein the dielectric layer is formed after the conductive layer has been patterned.

10. A method of forming an integrated chip, comprising:
 depositing a layer of conductive material onto an underlying layer to a line height in a single deposition process;
 forming a dielectric layer over the conductive layer to a via height, with at least one opening that exposes a via region of the conductive layer;
 forming a conductive via in the opening having the via height;
 patterning the conductive layer to form a conductive line having the line height; and
 further comprising forming an interlayer dielectric around the conductive line, after the conductive layer has been patterned, to a height of a top surface of the conductive via, from an ultra-low-k dielectric material.

11. The method of claim 10, wherein forming the dielectric layer comprises depositing dielectric material onto the conductive layer to the via height in a single deposition process.

12. The method of claim 11, wherein forming the dielectric layer further comprises masking the dielectric layer with a mask that exposes a top surface of the dielectric material above the via region of the conductive layer and anisotropically etching the exposed portion of the dielectric material to form the at least one opening.

13. The method of claim 10, wherein patterning the conductive layer comprises masking the dielectric layer with a mask that covers a line region of the conductive layer and anisotropically etching exposed portions of the dielectric layer and the conductive layer to form the conductive line.

14. The method of claim 10, wherein portions of the dielectric layer remain on the conductive line and wherein the interlayer dielectric is not formed over the conductive line.

15. An integrated chip, comprising:
 a plurality of conductive lines, having a line height that varies by less than one nanometer, each conductive line being formed with a profile that is narrower at a top surface of the line than at a bottom surface of the line; and
 an interlayer dielectric around and between the plurality of conductive lines, wherein there is no damage in the interlayer dielectric at interfaces between the interlayer dielectric and the plurality of conductive lines.

16. The integrated chip of claim 15, wherein at least one of the plurality of conductive lines includes a via.

17. The integrated chip of claim 16, wherein the via has a profile that is narrower at a bottom surface of the via than at a top surface of the via.

18. The integrated chip of claim 15, wherein the plurality of lines have a same height, within ±0.5 nm.

* * * * *